United States Patent
Bergmann et al.

(10) Patent No.: US 9,748,612 B2
(45) Date of Patent: Aug. 29, 2017

(54) BATTERY PACK HAVING A PLURALITY OF ELECTROCHEMICAL BATTERY CELLS HAVING A DEVICE FOR MEASURING A DIFFERENCE BETWEEN TWO CELL CURRENTS OF TWO DIFFERENT BATTERY CELLS

(71) Applicant: Robert Bosch GmbH, Stuttgart (DE)

(72) Inventors: Sven Bergmann, Stuttgart (DE); Alexander Reitzle, Neu-Ulm (DE); Sarmimala Hore, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/110,783

(22) PCT Filed: Dec. 30, 2014

(86) PCT No.: PCT/EP2014/079406
§ 371 (c)(1),
(2) Date: Jul. 11, 2016

(87) PCT Pub. No.: WO2015/104196
PCT Pub. Date: Jul. 16, 2015

(65) Prior Publication Data
US 2016/0329615 A1    Nov. 10, 2016

(30) Foreign Application Priority Data
Jan. 10, 2014   (DE) .................. 10 2014 200 304

(51) Int. Cl.
*H01M 10/48*    (2006.01)
*H01M 10/04*    (2006.01)
(Continued)

(52) U.S. Cl.
CPC ...... *H01M 10/482* (2013.01); *G01R 31/3606* (2013.01); *G01R 31/3658* (2013.01);
(Continued)

(58) Field of Classification Search
None
See application file for complete search history.

(56) References Cited

U.S. PATENT DOCUMENTS

| 5,250,903 A | 10/1993 | Limuti et al. |
| 8,570,047 B1 | 10/2013 | Davies et al. |

(Continued)

FOREIGN PATENT DOCUMENTS

| EP | 2325932 | 4/2012 |
| JP | 11054111 A * | 2/1999 |

(Continued)

OTHER PUBLICATIONS

JP 2011-024303 A Machine Translation, Feb. 3, 2011, retrieved Oct. 25, 2016.*

(Continued)

*Primary Examiner* — Barbara Gilliam
*Assistant Examiner* — Robert S Carrico
(74) *Attorney, Agent, or Firm* — Michael Best & Friedrich LLP

(57) ABSTRACT

The invention relates to a battery pack having a plurality of electrochemical battery cells, comprising a device for measuring a difference between two cell currents of two different battery cells, wherein a first battery cell has a first wound element, consisting of a first electrode layer and a second electrode layer, which causes a first magnetic field via a first of the cell currents, and a second battery cell has a second wound element, consisting of a third electrode layer and a fourth electrode layer, which causes a second magnetic field via a second of the cell currents, wherein the first and the second wound elements are arranged relative to each other such that the first magnetic field counteracts the second magnetic field in the case of the first and second cell current being rectified, wherein the battery pack additionally com- (Continued)

prises a magnetic field sensor which is configured to measure a superimposed field consisting of the first magnetic field and the second magnetic field, and comprises an evaluating unit which is configured to determine a difference between the first and the second cell current from the measured superimposed field.

10 Claims, 3 Drawing Sheets

(51) Int. Cl.
    *H01M 2/02*     (2006.01)
    *G01R 31/36*     (2006.01)
    *G01R 33/02*     (2006.01)
    *H01M 2/10*     (2006.01)
    *H01M 10/0525*     (2010.01)

(52) U.S. Cl.
    CPC ............ *G01R 33/02* (2013.01); *H01M 2/022* (2013.01); *H01M 2/0217* (2013.01); *H01M 2/1077* (2013.01); *H01M 10/0431* (2013.01); *H01M 10/0525* (2013.01); *H01M 2220/20* (2013.01)

(56) References Cited

U.S. PATENT DOCUMENTS

| | | | |
|---|---|---|---|
| 2010/0203368 A1* | 8/2010 | Matthias | ............... H01M 2/204 429/90 |
| 2011/0123843 A1* | 5/2011 | Poulsen | ............ H01M 10/0431 429/10 |
| 2011/0204889 A1 | 8/2011 | Nomura | |
| 2012/0116699 A1 | 5/2012 | Haag et al. | |

FOREIGN PATENT DOCUMENTS

| | | |
|---|---|---|
| JP | 2010127857 | 6/2010 |
| JP | 2011024303 | 2/2011 |
| JP | 2011174741 | 9/2011 |

OTHER PUBLICATIONS

JP 11-054111 A Machine Translation, Feb. 26, 1999, retrieved Oct. 25, 2016.*
International Search Report for Application No. PCT/EP2014/079406 dated Mar. 19, 2015 (English Translation 3, pages).

* cited by examiner

BATTERY PACK HAVING A PLURALITY OF ELECTROCHEMICAL BATTERY CELLS HAVING A DEVICE FOR MEASURING A DIFFERENCE BETWEEN TWO CELL CURRENTS OF TWO DIFFERENT BATTERY CELLS

BACKGROUND OF THE INVENTION

The present invention relates to a battery pack having a plurality of electrochemical battery cells, comprising a device for measuring a difference between two cell currents of two different battery cells.

It appears that new battery systems, such as, e.g., lithium-ion batteries, will increasingly be used in the future in stationary applications, such as, e.g., wind turbines and emergency power supplies, as well as in vehicles, such as, e.g., hybrid and electric vehicles. The latter case refers to traction secondary batteries. High demands are placed on such battery systems with regard to effective energy content, charging-discharging efficiency, the absence of a memory effect, service life and reliability.

In order to meet the requirements for a suitable system total voltage, power or energy, battery cells are connected in series or in parallel in such a battery system. The total battery is referred to as the battery pack. Said battery pack is divided into battery cells, battery modules, subunits, a cooling system, a degassing system, sensors and electronic control devices, such as, e.g., the cell supervision circuit (CSC), the battery control unit (BCU), the battery disconnect unit (BDU), current interrupt device (CID) and the battery management system (BMS).

In the case of end-user applications, cylindrical lithium-ion battery cells are primarily used. In the case of high-performance traction secondary batteries, prismatic lithium-ion battery cells in metallic housings consisting of aluminum or stainless steel are preferably used. In this case, there are also embodiments comprising two jelly rolls connected in parallel in a cell housing. A jelly roll is a wound element consisting of an anode layer and a cathode layer.

A battery having jelly rolls connected in parallel is known from the European patent EP232593B1. In this battery, the jelly rolls are oppositely wound and installed in a cell housing. This opposite sense of winding leads to a reduction in the electromagnetic radiation. The principle described in this patent application is also known for traction secondary batteries.

In order to effectively control and monitor lithium-ion batteries, a control of the current via two such jelly rolls is necessary. It is particularly important to detect a difference between two cell currents of two different jelly rolls in order to facilitate a uniform loading of all the cells, or respectively to prevent overloading individual cells.

SUMMARY OF THE INVENTION

The battery pack according to the invention having a plurality of electrochemical battery cells comprises a device for measuring a difference between two cell currents of two different battery cells, wherein a first battery cell has a first wound element, consisting of a first electrode layer and a second electrode layer, which causes a first magnetic field via a first of the cell currents, and a second battery cell has a second wound element, consisting of a third electrode layer and a fourth electrode layer, which causes a second magnetic field via a second of the cell currents, wherein the first and the second wound elements are arranged relative to each other such that the first magnetic field counteracts the second magnetic field in the case of the first and the second cell current being rectified, wherein the battery pack additionally comprises a magnetic field sensor, which is configured to measure a superimposed field consisting of the first magnetic field and the second magnetic field, and comprises an evaluating unit which is configured to determine a difference between the first and the second cell current from the measured superimposed field. The first and the second cell current are rectified if the first as well as the second cell current is a charging current of the respectively first or second battery cell or if the first as well as the second cell current is a discharging current of the respective first or second battery cell. Such a battery pack is advantageous because a direct electrical contacting of the components conducting the cell current is not necessary in order to detect a differential current. Measuring errors are thus kept to a minimum and the cost and effort for contacting the components are eliminated. Particularly in the case of high cell currents and/or voltages, a costly and elaborate insulation of the device for measuring the difference between the cell currents is not necessary.

In particular, the first and the third electrode layer are contacted to an inner section of the respective wound element and the second and fourth electrode layer are contacted to an outer section of the respective wound element, wherein the inner section lies further inside the respective wound element than the outer section. As a result, it is ensured that a cell current flows at least almost completely through the windings of a wound element, and thus a strong first and second magnetic field are generated. A strong magnetic field can be detected with little cost and effort, i.e. by cost-efficient magnetic field sensors, and the measurement result achieved in this manner is less distorted by interference fields.

It is advantageous if the first battery cell is connected in parallel with the second battery cell. By connecting two battery cells in such a manner, a state of health or a state of ageing or a differing state of charge of the battery cells can be compared via a resulting differential current due to the same load acting on the battery cells connected in parallel.

In addition, it is advantageous if a first imaginary winding axis of the first wound element is disposed parallel and adjacent to a second imaginary winding axis of the second wound element, wherein the first wound element is wound oppositely to the second wound element in this arrangement. By means of the symmetrical current flow in such an embodiment, very little electromagnetic interference emanates from such a battery pack.

It is advantageous if the magnetic field sensor is disposed at a location at which the first magnetic field and the second magnetic field cancel each other out when the first and the second cell current are equally large and are rectified. Hence, it can be detected by particularly simple means whether there is an imbalance, i.e. a difference, between the first and the second of the cell currents. In this case, there is always a difference if the superimposed field has a field strength that does not equal zero. A calibration of the evaluating unit can be omitted in this case.

It is furthermore advantageous if the first electrode layer is connected in an electrically conductive manner to the voltage tap via a first electrical conductor, the second electrode layer is connected in an electrically conductive manner to a second voltage tap via a second electrical conductor, the third electrode layer is connected to a third voltage tap via a third electrical conductor and the fourth electrode layer is connected in an electrically conductive manner to a fourth voltage tap via a fourth electrical conductor, wherein the first and the second electrical conductor are disposed at least in part symmetrically to the third and fourth electrical conductor. In so doing, a symmetrical current conduction is achieved. This advantageously leads to an at least partial compensation of magnetic fields, which could overlap the magnetic fields required for the measurement in an uncompensated manner. The first and the second electrical conductor can be disposed at least partially plane-symmetrically to the third and fourth electrical conductor, wherein the conductors are symmetrical in relation to an imaginary plane of symmetry, which defines a plane symmetry between the first and the second imaginary winding axes that are plane-symmetrical with respect to one another.

It is likewise advantageous if the battery pack comprises a plurality of first and second battery cells, wherein the first and the second wound elements are arranged relative to one another such that each first magnetic field is directed oppositely to each second magnetic field in the case of the first and second cell currents being rectified, and the first and second wound elements having alternating magnetic field direction are arranged in a row, wherein the magnetic field sensor is configured to measure a superimposed field consisting of the first magnetic field of a first wound element and a second magnetic field of the adjacent second wound element. In this way, a plurality of current differences can be measured in a battery pack, wherein only a minimal or no mutual influence on the measurements by the magnetic fields results on the measurement of the involved battery cells.

In another variant, a first battery cell and a second battery cell are disposed in a common battery cell housing. By arranging the first battery cell and the second battery cell in a common battery cell housing, a unit is created which causes a minimal magnetic interference field.

The first battery cell and the second battery cell are particularly disposed in different battery cell housings. The magnetic field sensor can then be disposed between the battery cell housings. Hence, individually replaceable units are created, in which a decision can be made by means of the measured difference between two cell currents as to whether one of the units is faulty and has to be replaced.

It is advantageous if the magnetic field sensor is disposed between two adjacent battery cell housings. As a result, battery cells which do not comprise a magnetic field sensor can be used in a battery pack according to the invention. When replacing a battery cell, which in most cases takes place with the battery cell housing, the magnetic field sensor can be retained. Additional costs and additional effort for calibration can be avoided.

It is advantageous if the magnetic field sensor is a Hall sensor because such a sensor is available as a cost-efficient standard component. In addition, the superimposed field can be particularly precisely measured using a Hall sensor.

The battery pack according to the invention is advantageously a vehicle battery, in particular a traction battery. A reliable construction of the differential current measuring device is particularly advantageous on account of the frequent charging and discharging processes and the particularly high demands on such a battery.

BRIEF DESCRIPTION OF THE DRAWINGS

Exemplary embodiments of the invention are subsequently described in detail with reference to the accompanying drawings. In the drawings.

DETAILED DESCRIPTION

Figure 1:
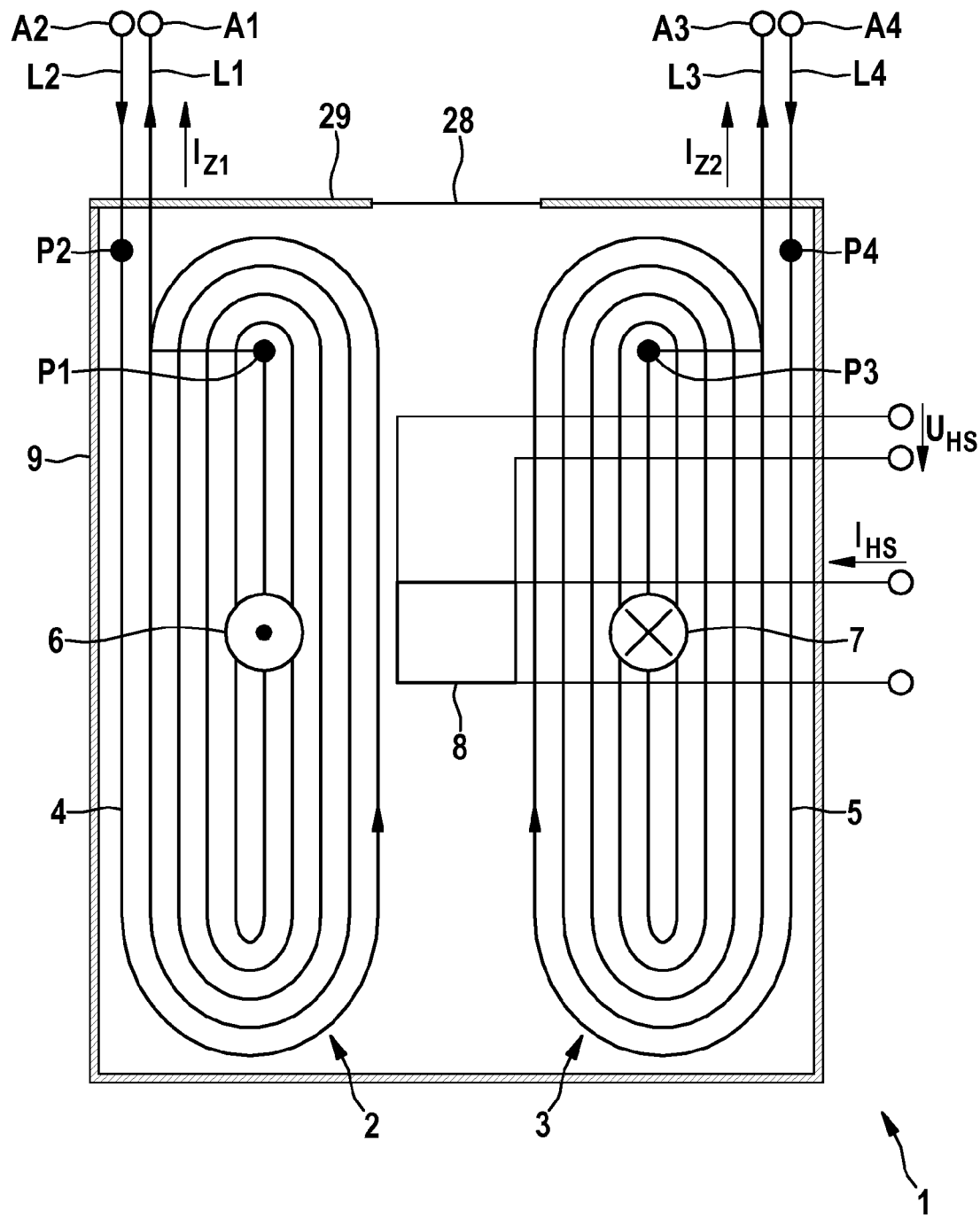
FIG. 1 shows a schematic depiction of a battery pack 1 according to the invention in a first embodiment.

FIG. 1 shows a schematic depiction of a battery pack 1 according to the invention in a first embodiment.

The battery pack 1 comprises a first battery cell 2, which has a first wound element 4 consisting of a first electrode layer and a second electrode layer. The first battery cell 2 is an electrochemical battery cell. During discharge, the first electrode layer constitutes a cathode of the first battery cell 2 and the second electrode layer a first anode of the first battery cell 2 in this embodiment. Such a first wound element 4 additionally comprises typically one or a plurality separator layers that are wound together with the electrode layers and prevent a short circuit between anode and cathode. During charging, the roles of anode and cathode are changed. The discharging process is looked at below.

The first wound element 4 has a first imaginary winding axis. The first imaginary winding axis is an axis which lies in the winding center of the winding layers of the first wound element 4. In the first embodiment of the invention shown here, the first imaginary winding axis lies on an imaginary plane in the center of the first wound element 4, the electrode layers being wound about said first imaginary plane. In so doing, the first imaginary winding axis lies parallel to the first magnetic field 6.

The first anode is contacted on an inner section of the first wound element 4. To this end, a first anode contact point P1 is selected for contacting in this exemplary embodiment, which contact point lies on the first anode and on an innermost section of the first wound element 4. At the same time, said contact point is preferably accessible from an end face of the first wound element 4. The first cathode is contacted on an outer section of the first wound element 4. To this end, a first cathode contact point P2 is selected for contacting in this embodiment, which contact point lies on the first cathode and is a far as possible away from the imaginary winding core of the first wound element 4 if one follows the winding paths of the first cathode and the first anode. The inner section thus lies further inward in the first wound element 4 than the outer section.

A first cell current $I_{z1}$ flows across the first anode contact point P1, the first wound element 4 and the cathode contact point P2. The first cell current $I_{z1}$ can be completely or partially induced by the electrochemical first battery cell 2. By virtue of the fact that the first cell current $I_{z1}$ flows along a wound, electrically conductive path formed by the first cathode and the first anode, a first magnetic field 6 is generated, similarly to the case of a coil.

The battery pack 1 further comprises a second electrochemical battery cell 3, which has a second wound element 5 consisting of a third electrode layer and a fourth electrode layer. In this embodiment, the third electrode layer constitutes a second cathode of the second battery cell 3 and the fourth electrode layer a second anode of the second battery cell 3. Such a second wound element 5 further comprises typically one or a plurality of separator layers that are wound together with the electrode layers and prevent a short circuit between the second cathode and the second anode. The first wound element 4 or respectively the second wound element 5 is referred to as a jelly roll.

The second wound element 5 has a second imaginary winding axis. The second imaginary winding axis is an axis which lies in the winding center of the winding layers of the second wound element 5. In the embodiment of the invention shown here, the second imaginary winding axis lies on an imaginary plane in the center of the second wound element about which plane the electrode layers are wound.

The second anode is contacted on an inner section of the second wound element 5. To this end, a second anode contact point PS is selected for contacting in this exemplary embodiment, which lies at a position on the second anode layer that lies on an innermost section of the second wound element 5. At the same time, said anode contact point PS is preferably accessible from an end face of the second wound element 5. The second cathode is contacted on an outer section of the second wound element 5. To this end, a second cathode contact point P4 is selected for contacting in this exemplary embodiment, which lies at a position on the second cathode which is as far away as possible from the imaginary winding core of the second wound element 5 if one follows the winding paths of the second cathode and the second anode. The inner section thus lies further inward in the second wound element 5 than the outer section.

A second cell current $I_{z2}$ flows across the second anode contact point P3, the second wound element 5 and the second cathode contact point P4. The second cell current $I_{Z2}$ can be completely or partially induced by the electrochemical second battery cell 3. By virtue of the fact that the second cell current $I_{Z2}$ flows along a wound, electrically conductive path formed by the second cathode and the second anode, a second magnetic field 7 is generated, similarly to the case of a coil.

In this first embodiment of the invention, the first wound element 4 and the second wound element 5 are sized the same with respect to the surfaces of the electrode layers thereof, the winding density thereof and the external dimensions thereof. The first and the second battery cell 2, 3 are disposed in a common battery cell housing 9. In so doing, the first imaginary winding axis is disposed parallel and adjacent to the second imaginary winding axis. In this arrangement, the first wound element 4 is wound in the opposite direction with respect to the second wound element 5. As can be seen in FIG. 1, the first wound element 4 is wound in a clockwise direction in the view depicted, and the second wound element 5 is wound in the counterclockwise direction in the same depicted view. The common battery cell housing 9 comprises a battery cell housing cover 29 with a burst valve 28.

The connection lines in the battery cell housing 9 should be laid symmetrically in relation to one another for the first and the second wound element. As a result, the electromagnetic fields generated by a current flow on the lines are configured in such a way that they mutually cancel each other out. The radiated interferences are thereby minimized. The first anode contact point P1 is connected in an electrically conductive manner to a first minus pole connection A1 arranged on the battery cell housing 9 via a first electrical conductor L1. The first cathode contact point P2 is connected in an electrically conductive manner to a first positive pole connection A2 arranged on the battery cell housing 9 via a second electrical conductor L2. The second negative contact point P3 is connected in an electrically conductive manner to a minus pole connection A3 arranged on the battery cell housing 9 via third electrical conductor L3. The second positive contact point P4 is connected in an electrically conductive manner to a second plus pole connection A4 arranged on the battery cell housing 9 via a fourth electrical conductor L4. The first electrical conductor L1 is preferably disposed symmetrically to the third electrical conductor L3 in the battery cell housing; and the second electrical conductor L2 is preferably disposed symmetrically to the fourth electrical conductor L4 in the battery cell housing. As a result, a plane forms a plane of symmetry which also constitutes a plane of symmetry with respect to the first and the second battery cell 2, 3. The first plus pole connection A2 and the second plus pole connection A4 can additionally be connected in an electrically conductive manner to a cathode terminal or a plus pole of the battery pack. The first minus pole connection A1 and the second minus pole connection A3 can additionally be connected in an electrically conductive manner to an anode terminal or a minus pole of the battery pack.

The first wound element 4 and the second wound element 5 are arranged relative to each other such that the first magnetic field 6 counteracts the second magnetic field 7 in the case of the first and second cell current $I_{Z1}$, $I_{Z2}$ being rectified. The first and the second cell current $I_{Z1}$, $I_{Z2}$ are rectified if the first as well as the second cell current $I_{Z1}$, $I_{Z2}$ is a charging current of the of the respectively first battery cell 2 or the second battery cell 3 or if the first as well as the second cell current $I_{z1}$, $I_{z2}$ is a discharging current of the respectively first battery cell 3 or second battery cell 4. If, therefore, a discharging current is emitted in each case from the first battery cell 3 and the second battery cell 4 as a first or as a second cell current $I_{Z1}$, $I_{Z2}$, at least one surface region is then formed in the surrounding area of the first and second battery cell 3, 4 in which a component of the first magnetic field 6 and a component of the second magnetic field 7 act in opposition to one another. The first magnetic field 6 forms together with the second magnetic field 7 a superimposed field in this surface region. In the first embodiment described here, such a surface region is located within the battery cell housing 9 centrally between the winding centers of the first wound element 4 and the second wound element 5. A magnetic field sensor is disposed in this surface region. The magnetic field sensor is formed by a Hall sensor 8. In this case, the Hall sensor 8 is therefore disposed at a location at which the first magnetic field 6 and the second magnetic field 7 cancel each other out in the case of the first and second cell current $I_{Z1}$, $I_{Z2}$ being equally large and rectified. The Hall sensor 8 is preferably equally spaced apart from the imaginary winding axis of the first wound element 4 and the imaginary winding axis of the second wound element 5. As a result, the Hall sensor 8 is penetrated to the same degree by the two oppositely oriented magnetic fields in the case of the first and second cell current $I_{Z1}$, $I_{Z2}$ being equally large and rectified. Provided that the first and the second magnetic field 6, 7 are equally large, the resulting magnetic flux through the Hall sensor 9 is equal to zero.

The cell currents $I_{Z1}$, $I_{Z2}$ flowing through the first and the second wound element 4, 5 generate opposite magnetic fields which cancel each other out in the case of the number of windings, winding densities and currents ($I_{Z1}=I_{Z2}$) being equal. The generated magnetic fields, i.e. the first magnetic field 6 and the second magnetic field 7 are proportional to the cell currents $I_{Z1}$, $I_{Z2}$ flowing through the wound elements 4, 5.

A sensor current $I_{HS}$ flows through the Hall sensor 8. This sensor current $I_{HS}$ can, for example, be provided via a battery controller. If a superimposed field is detected by the Hall sensor 8, a Hall voltage $U_{HS}$ is emitted by the same. This Hall voltage $U_{HS}$ is supplied to an evaluating unit that is not shown in the figures. In order that the charging and discharging currents through the first and the second wound element 4, 5 are equally large, the electrical resistances thereof are preferably the same. In the case of the magnetic fields not being equal, i.e. the first and the second cell current $I_{Z1}$, $I_{Z2}$ being different, a Hall voltage $U_{HS}$ that does not equal 0V can be measured at the voltage tap of the Hall sensor 8. The Hall sensor 8 is therefore used for a potential-free current measurement.

The evaluating unit determines a difference between the first cell current $I_{Z1}$ and the second cell current $I_{Z2}$ from the Hall voltage $U_{HS}$ and therefore from the measured superimposed field. By means of the equal sizing of the first and the second wound elements 4, 5 and the central arrangement of the Hall sensor 8, a superimposed field having the amount zero and thus the Hall voltage $U_{HS}$ of 0V results for the case that the first cell current $I_{Z1}$ is equal to the second cell current $I_{Z2}$ (in the case of the first and the second cell current $I_{Z1}$, $I_{Z2}$ being rectified). The difference between the first cell current $I_{Z1}$ and the second cell current $I_{Z2}$ is therefore 0 A.

If the first cell current $I_{Z1}$ is greater than the second cell current $I_{Z2}$, the first magnetic field 6 will be dominant in the superimposed field and will define the direction of flow of a magnetic flux of the superimposed field through the Hall sensor. Depending on the orientation of the Hall sensor, a positive or a negative Hall voltage $U_{HS}$ is emitted by the Hall sensor. If the first cell current $I_{Z1}$ is smaller than the second cell current $I_{Z2}$, the second magnetic field 7 will be dominant in the superimposed field and will define the direction of flow of the magnetic flux through the Hall sensor. A Hall voltage $U_{HS}$ is emitted by the Hall sensor 8 which is opposite in sign in comparison to a Hall voltage $U_{HS}$ in the case of a dominant first magnetic field 6.

The emitted Hall voltage $U_{HS}$ can, for example, be translated via a predefined table into a differential value which describes a difference between the first cell current $I_{Z1}$ and the second cell current $I_{Z2}$ or between other current units in amperes. Such a table could be created from values ascertained on an experimental basis.

The difference in the following currents through the two battery cells 2, 3 can be measured;
  self-discharging currents—For this purpose, the sensor current $I_{HS}$ has to set relatively large to increase the speed of the Hall sensor 8. It can be determined from the polarity of the Hall voltage $U_{HS}$ which of the wound elements 4, 5 has the larger self-discharging current. The level of the Hall voltage $U_{HS}$ indicates how large the self-discharge current difference is.
  charging and discharging currents—For this purpose, the sensor current $I_{HS}$ of the Hall sensor has to be set relatively small. The charging and discharging currents are in the range of approximately 16, so that the Hall sensor 8 can be set to be less sensitive.

Because a positioning of the Hall sensor 8 in a region which lies precisely centrally between the first wound element 4 and the second wound element 5 is difficult and because the first wound element 4 is not dimensioned exactly the same as the second wound element on account of production inaccuracies, a zero value calibration may be necessary. In so doing, the Hall voltage $U_{HS}$ of the Hall sensor 8 is read when the first and second cell currents $I_{Z1}$, $I_{Z2}$ are identical. This value is then considered to be the zero value. If the Hall voltage $U_{HS}$ is above or below this value, the first or the second magnetic field 6, 7 is respectively dominant in the superimposed field and thus the respective first cell current $I_{Z1}$ or the second cell current $I_{Z2}$ prevails. If the Hall voltage $U_{HS}$ is equal to the zero value, the first cell current $I_{Z1}$ is then equal to the second cell current $I_{Z2}$.

In addition to the elements shown in FIG. 1, such a battery pack 1 can comprise further components, such as, e.g., a battery controller, separation elements or further conducting elements, which are not shown in FIG. 1.

Figure 2:
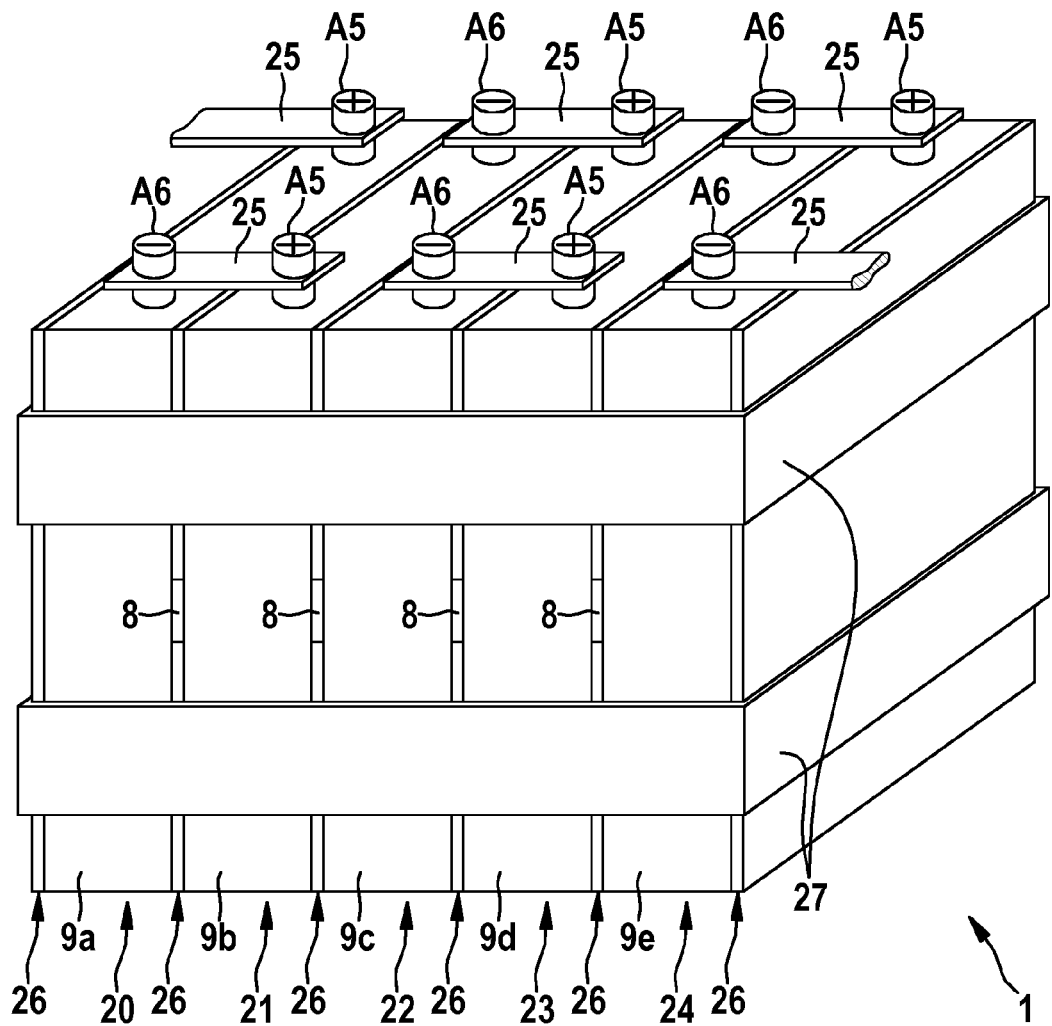
FIG. 2 shows a schematic depiction of a battery pack 1 according to the invention in a second embodiment.

FIG. 2 shows a schematic depiction of a battery pack 1 according to the invention in a second embodiment. In this second embodiment, the battery pack 1 comprises a plurality of battery cell units 20 to 24. The battery cell units 20 to 24 are structurally identical battery cell units 20, 21, 22, 23, 24. The battery cell units 20, 21, 22, 23, 24 are formed in the external form thereof by a battery cell housing 9a, 9b, 9c, 9d, 9e associated in each case with said battery cell units. The battery cell housings 9a, 9b, 9c, 9d, 9e have substantially the form of a cuboid. A positive voltage tap A5 and a negative voltage tap A6 are disposed in each case on a connection side. The battery cell units 20, 21, 22, 23, 24 are disposed next to one another in such a way that a negative voltage tap A6 is in each case next to a positive voltage tap A5 of an adjacent battery cell unit. To this end, the battery cell units 20, 21, 22, 23, 24 are in each case rotated relative to each other by 180°, wherein the voltage taps A5, A6 thereof lie on a common side of the cuboid. In order to improve the heat dissipation, an aluminum plate 26 is disposed between respectively two adjacent battery cell units so as to be flush with the battery cell housings 9a, 9b, 9c, 9d, 9e. The battery cell units 20, 21, 22, 23, 24 and the aluminum plates are fixed to one another in this position by two tensioning bands 27. In the case of battery packs 1 comprising cooling channels, the battery cell units 20, 21, 22, 23, 24 can be held and fixed by means of a suitable spacer frame instead of aluminum plates 26. This spacer frame can also accommodate the Hall sensor(s) 8.

Each positive voltage tap A5 is connected to the negative voltage tap A6 of a battery cell unit adjacent thereto via an electrically conductive cell connector 25. In so doing, the battery cell units 20, 21, 22, 23, 24 are connected via the cell connector 25 in such a manner that a series circuit of said battery cell units 20, 21, 22, 23, 24 results. In the case of such juxtaposed, serially connected battery cell units 20, 21, 22, 23, 24 having an aluminum housing in a battery pack 1, oppositely poled voltage taps A5, A6 always lie next to one another; thus enabling short cell connectors 25 to be used.

Respectively one Hall sensor 8 serving as a magnetic field sensor is disposed between each of the respectively adjacent battery cell units 20, 21, 22, 23, 24. To this end, a recess corresponding to the shape of the Hall sensor 8 is introduced in the center of each of the aluminum plates 26. The Hall sensor 8 is disposed in this recess. This recess can be extended in the direction of an edge region of the aluminum plate 26 in order to accommodate a cabling of the Hall sensor 8. To this end, the aluminum plate 26 particularly has a thickness, which corresponds at least to a thickness of the Hall sensor 8.

The battery pack 1 in the second embodiment comprises a plurality of first and second battery cells 2, 3. In so doing, a first and a second battery cell 2, 3 are in each case disposed in a battery cell unit 20, 21, 22, 2, 24.

Figure 3:
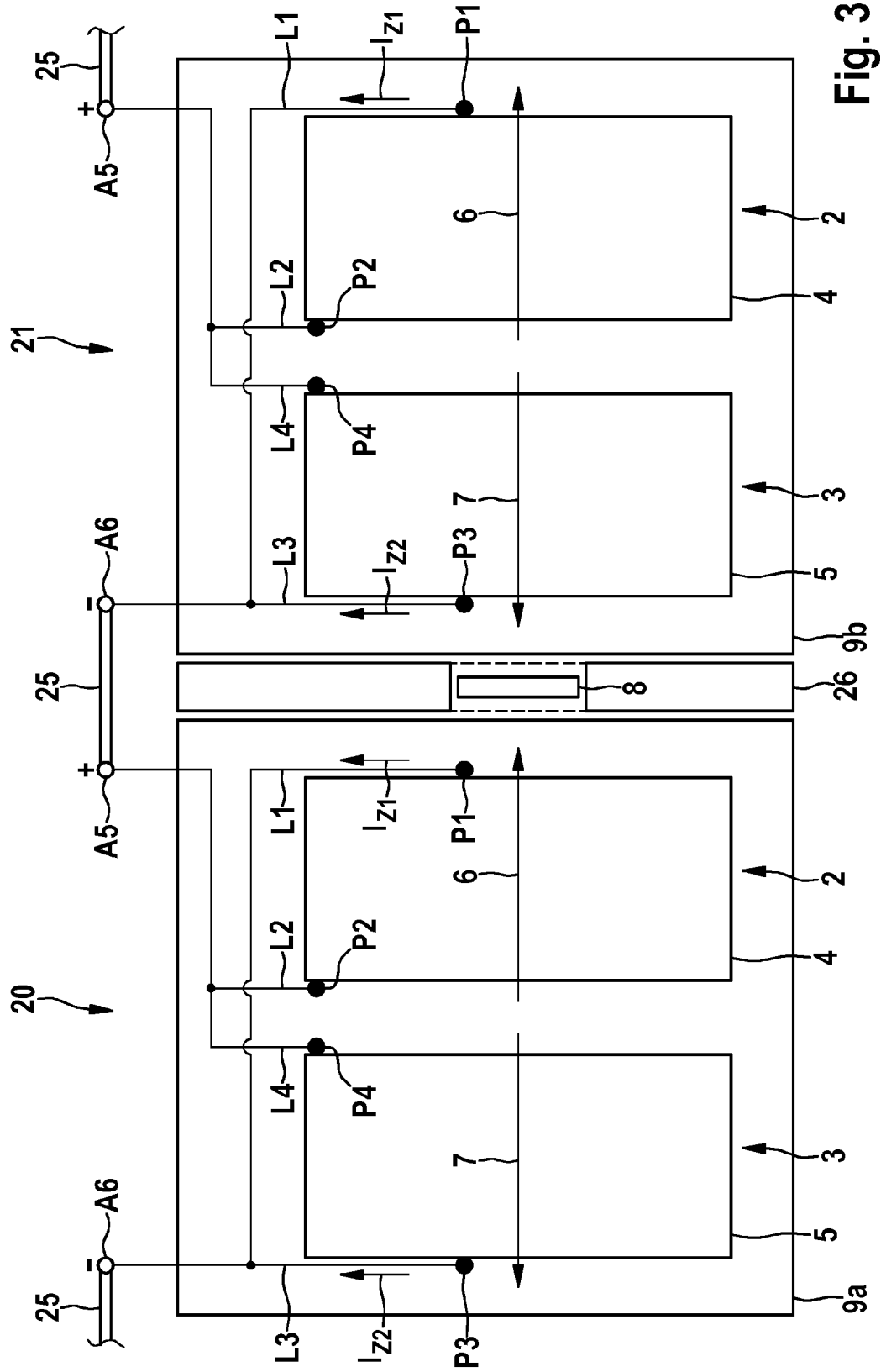
FIG. 3 shows a schematic depiction of a plurality of first and second battery cells 2, 3 arranged according to the invention pursuant to the second embodiment.

FIG. 3 shows a schematic depiction of a first battery cell unit 20 and a second battery cell unit 21 of the battery pack 1 or respectively the arrangement of two first battery cells 2 and two second battery cells 3 in the battery pack 1. The first battery cells 2 and thus the respective first wound element 4 as well as the respective first anode contact point P1 and the respective first cathode contact point are configured according to the previously described first embodiment of the invention. The second battery cells 3 and thus the respective second wound element 5 as well as the respective second anode contact point P3 and the respective second cathode contact point P4 are configured according to the previously described first embodiment of the invention. A respective first cell current $I_{Z1}$ flows through the first wound element 4 of the respective first battery cells. A respective second cell current $I_{Z2}$ flows through the second wound element 5 of the respective second battery cells.

The first and the second wound elements 4, 5 are thereby arranged relative to one another such that each first magnetic field 6 is directed oppositely to each second magnetic field 7 in the case of the first and second cell currents $I_{Z1}$, $I_{Z2}$ being rectified; and the first and second wound elements 4, 5 are disposed alternately in a row. To this end, the imaginary winding axes of the first and the second wound elements 4, 5 are disposed approximately in a line in the arrangement thereof in the battery pack 1. Because the first or the second wound elements 4, 5 are also structurally identical in this embodiment, each wound element 4, 5 is thus rotated by respectively 180 degrees relative to the directly adjacent elements, wherein the axis of rotation is perpendicular to the imaginary winding axis. One of the first wound elements 4 and an adjacent second wound element 5 are disposed in a first battery cell housing 9a. Another of the first wound elements 4 and another adjacent second wound element 5 are disposed in a second battery cell housing 9b. All of the battery cells of the battery pack are accommodated in pairs in a battery cell housing. The battery cell housings 9a, 9b, 9c, 9d, 9e are particularly made from aluminum.

A first electrical conductor L1 is connected in an electrically conductive manner in the first or respectively second battery cell unit 20, 21 in each case to the first anode contact point P1 and the negative voltage tap A6. A first electrical conductor L1 is connected in an electrically conductive manner in the first or respectively the second battery cell unit 20, 21 in each case to the first anode contact point P1 and the negative voltage tap A6. A third electrical conductor L3 is connected in an electrically conductive manner in the first or respectively the second battery cell in each case to the second cathode contact point P3 and the negative voltage tap A6. A second electrical conductor L2 is connected in an electrically conductive manner in the first or respectively the second battery cell unit in each case to the first cathode contact point P2 and the positive voltage tap A5. A fourth electrical conductor L4 is connected in an electrically conductive manner in the first or respectively the second battery cell unit 20, 21 in each case to the second cathode contact point P4 and the positive voltage tap A5. In this way, the first and the second battery cell of each battery cell unit are in each case connected in parallel with each other.

Because the first battery cell unit 20 and the second battery cell unit 21 are adjacent to one another and are only separated from one another by the aluminum plate 35 or respectively the Hall sensor 8, a superimposed field forms between the first and the second battery cell unit 20, 21. The superimposed field is measured by the Hall sensor 8 disposed at this location. According to the first embodiment, this measured value can be correspondingly transposed into a differential value between the first cell current $I_{Z1}$ of the first battery cell unit and the second cell current $I_{Z2}$ of the second battery cell unit.

A corresponding measurement can be carried out by each of the Hall sensors 8. Hence, a difference can in each case be measured between the first cell current $I_{Z1}$ and the second cell current $I_{Z2}$ of two adjacent battery cells.

The battery cell units 20, 21, 22, 23, 24 are preferably structurally identical. For that reason, it is dependent on the alignment of the battery cell unit whether a battery cell is considered to be a first battery cell 2 or a second battery cell 3.

In an optional variant of the second embodiment, not shown in the figures, the imaginary winding axes of the first and the second wound elements 4, 5 are disposed approximately parallel to one another in the arrangement thereof in the battery pack 1. The arrangement of two adjacent first and second wound elements 4, 5 relative to one another then corresponds to the first embodiment.

The invention claimed is:

1. A battery pack having a plurality of electrochemical battery cells, comprising a device for measuring a difference between two cell currents of two different battery cells, wherein a first battery cell has a first wound element including a first electrode layer and a second electrode layer, which causes a first magnetic field via a first of the cell currents, and a second battery cell has a second wound element including a third electrode layer and a fourth electrode layer, which causes a second magnetic field via a second of the cell currents, wherein the first and the second wound elements are arranged relative to each other such that the first magnetic field counteracts the second magnetic field in the case of the first and second cell current being rectified, wherein the battery pack additionally comprises:

a magnetic field sensor which is configured to measure a superimposed field formed by the first magnetic field and the second magnetic field, wherein the magnetic field sensor is centrally positioned between a first winding center of the first wound element and a second winding center of the second wound element, wherein the magnetic field sensor is positioned between the first battery cell and the second battery cell, and an evaluating unit which is configured to determine a difference between the first cell current and the second cell current from the measured superimposed field.

2. The battery pack according to claim 1, characterized in that the first and the third electrode layer are contacted on an inner section of the respective wound element, and the second and the fourth electrode layer are contacted on an outer section of the of the respective wound element, the inner section lying further inside the respective wound element than the outer section.

3. The battery pack according to claim 1, characterized in that the first battery cell is connected in parallel with the second battery cell.

4. The battery pack according to claim 1, characterized in that a first imaginary winding axis of the first wound element is disposed parallel and adjacent to a second imaginary winding axis of the second wound element, the first wound element being wound oppositely to the second wound element in this arrangement.

5. The battery pack according to claim 1, characterized in that the magnetic field sensor is disposed at a location at which the first magnetic field and the second magnetic field cancel each other out in the case of the first and second cell current being equally large and rectified.

6. The battery pack according to claim 1, characterized in that:

the first electrode layer is connected in an electrically conductive manner to a first voltage tap via a first electrical conductor, the second electrode layer is connected in an electrically conductive manner to a second voltage tap via a second electrical conductor, the third electrode layer is connected in an electrically conductive manner to a third voltage tap via a third electrical conductor, the fourth electrode layer is connected in an electrically conductive manner to a fourth voltage tap via a fourth electrical conductor, wherein the first and the second electrical conductor are disposed at least partially symmetrically with respect to the third and fourth electrical conductor.

7. The battery pack according to claim 1, characterized in that the first battery cell and the second battery cell are disposed in a common battery cell housing.

8. The battery pack according to claim 1, characterized in that the first battery cell and the second battery cell are disposed in different battery cell housings.

9. A battery pack having a device for measuring a difference between two cell currents of two different battery cells, the battery pack comprising:

a plurality of electrochemical battery cell units, wherein each of the plurality of electrochemical battery cell units includes a first battery cell having a first wound element including a first electrode layer and a second electrode layer, which causes a first magnetic field via a first of the cell currents, the first battery cell positioned within a first housing and a second battery cell having a second wound element including a third electrode layer and a fourth electrode layer, which causes a second magnetic field via a second of the cell currents, the second battery cell positioned within a second housing different than the first housing, wherein the first and the second wound elements are arranged relative to one another such that each first magnetic field is directed oppositely to each second magnetic field in the case of the first and second cell currents being rectified, and the first and second wound elements having alternating magnetic field directions are disposed in a row;

a magnetic field sensor configured to measure a superimposed field formed by a first magnetic field of a first wound element and a second magnetic field of the adjacent second wound element, wherein the magnetic field sensor is centrally positioned between a first winding center of the first wound element and a second winding center of the second wound element, wherein the magnetic field sensor is positioned between the first battery cell and the second battery cell; and an evaluating unit which is configured to determine a difference between the first cell current and the second cell current from the measured superimposed field.

10. The battery pack according to claim 9, characterized in that the magnetic field sensor is disposed between the first battery cell housing and the second battery cell housing, wherein the first battery cell housing is adjacent to the second battery cell housing.

* * * * *